US007494596B2

(12) United States Patent
Barnes et al.

(10) Patent No.: US 7,494,596 B2
(45) Date of Patent: Feb. 24, 2009

(54) MEASUREMENT OF ETCHING

(75) Inventors: Ted W. Barnes, Corvallis, OR (US); Victorio Chavarria, Corvallis, OR (US); William J. Sudyka, Corvallis, OR (US); Adam Ghozeil, Corvallis, OR (US); Timothy R. Emery, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 304 days.

(21) Appl. No.: 10/393,735

(22) Filed: Mar. 21, 2003

(65) Prior Publication Data

US 2004/0182513 A1 Sep. 23, 2004

(51) Int. Cl.
*H01L 21/306* (2006.01)

(52) U.S. Cl. ........................................................ 216/27

(58) Field of Classification Search ........................ None
See application file for complete search history.

(56) References Cited

U.S. PATENT DOCUMENTS 4,351,706 A * 9/1982 Chappell et al. ............ 205/655
4,358,338 A 11/1982 Downey et al.
4,648,936 A * 3/1987 Ashby et al. ................ 438/708
4,767,496 A * 8/1988 Hieber ........................ 438/17
5,015,323 A * 5/1991 Gallagher ................ 156/345.1
5,055,889 A * 10/1991 Beall .......................... 257/277
5,132,648 A * 7/1992 Trinh et al. ................. 333/128
5,357,131 A * 10/1994 Sunami et al. .............. 257/301
5,573,624 A * 11/1996 Barbee et al. .......... 156/345.16
5,591,300 A * 1/1997 Schiller ....................... 438/16
5,637,189 A 6/1997 Peeters et al.
5,699,282 A * 12/1997 Allen et al. .................... 702/85
5,788,801 A 8/1998 Barbee et al.
5,872,390 A * 2/1999 Lee et al. ..................... 257/529
5,879,973 A * 3/1999 Yanai et al. ................. 438/161
6,015,978 A * 1/2000 Yuki et al. ..................... 257/25
6,016,062 A * 1/2000 Nicollian et al. ............ 324/769
6,084,648 A * 7/2000 Yeo ............................. 349/40
6,127,237 A 10/2000 Tsuchiaki
6,204,073 B1 * 3/2001 Nandakumar et al. ......... 438/17
6,228,690 B1 * 5/2001 Mikuni ........................ 438/132
6,297,644 B1 * 10/2001 Jarvis et al. ................. 324/537
6,323,097 B1 * 11/2001 Wu et al. ..................... 438/384
6,342,401 B1 * 1/2002 Tom ............................ 438/17
6,437,567 B1 * 8/2002 Schenck et al. ............. 324/318
6,448,098 B1 * 9/2002 Milor .......................... 438/17
6,476,458 B2 * 11/2002 Miyajima ................... 257/496
6,531,379 B2 * 3/2003 Furukawa et al. ........... 438/558
6,573,561 B1 * 6/2003 Chidambarrao et al. ..... 257/335
6,599,761 B2 * 7/2003 Hess et al. ..................... 438/11
6,762,133 B1 * 7/2004 Rangarajan et al. ......... 438/745
6,828,647 B2 * 12/2004 Schafbauer et al. ......... 257/509
6,969,655 B2 * 11/2005 Kim ........................... 438/267
2001/0010573 A1 * 8/2001 Ohta et al. .................. 349/139

(Continued)

FOREIGN PATENT DOCUMENTS

JP 58147123 9/1983

(Continued)

*Primary Examiner*—Allan Olsen

(57) ABSTRACT

Methods and apparatus for determining the extent of etching in material by locating a detector element adjacent to a portion of the material that is to be etched. The width of the element varies. The resistance of the element is measured upon etching the portion.

25 Claims, 2 Drawing Sheets

U.S. PATENT DOCUMENTS

| | | | | |
|---|---|---|---|---|
| 2001/0054709 | A1 | 12/2001 | Heath et al. | |
| 2002/0176276 | A1 | 11/2002 | Zhang et al. | |
| 2002/0185469 | A1 * | 12/2002 | Podlesnik et al. | 216/41 |
| 2003/0022397 | A1 * | 1/2003 | Hess et al. | 438/11 |
| 2003/0027397 | A1 * | 2/2003 | Gau | 438/362 |
| 2003/0042800 | A1 * | 3/2003 | Money | 310/26 |
| 2003/0142453 | A1 * | 7/2003 | Parker et al. | 361/104 |
| 2003/0168715 | A1 * | 9/2003 | Bae | 257/529 |
| 2004/0021155 | A1 * | 2/2004 | Harada | 257/222 |
| 2004/0021743 | A1 * | 2/2004 | Ottenheimer et al. | 347/65 |
| 2004/0066601 | A1 * | 4/2004 | Larsen | 361/234 |
| 2004/0241999 | A1 * | 12/2004 | Livengood et al. | 438/689 |
| 2005/0017313 | A1 * | 1/2005 | Wan | 257/415 |

FOREIGN PATENT DOCUMENTS

| | | |
|---|---|---|
| JP | 60-167332 | 8/1985 |
| JP | 10044407 | 2/1998 |

* cited by examiner

MEASUREMENT OF ETCHING

BACKGROUND OF THE INVENTION

In various applications of microfabrication technology, mechanical and electrical components are fabricated in or on a substrate such as silicon, which is part of a conventional silicon wafer. The resulting micro-electro-mechanical system (known by the acronym MEMS) is the integration of mechanical elements, sensors, actuators, and electronics on the substrate. The electronics are fabricated using integrated circuit (IC) processes, and the micromechanical components are fabricated by micromachining. Such fabrication often calls for the creation of features such as trenches or slots in the substrate. The removal of material to form such features is often carried out by etching. Moreover, other layers of material that are formed on the substrate are patterned and etched to define their final configuration.

There are a number of ways to etch silicon or other material. Irrespective of how the material is etched, it is usually desirable to determine precisely the extent of etching during and/or after the etching process.

SUMMARY OF THE INVENTION

The present invention is directed to methods and apparatus for determining the extent of etching of material by locating a detector element adjacent to a portion of the material that is to be etched. The width of the element varies. The resistance of the detector element is measured upon etching the portion.

The methods and apparatus for carrying out the invention are described in detail below. Other advantages and features of the present invention will become clear upon review of the following portions of this specification and the drawings.

DETAILED DESCRIPTION

Figure 1:
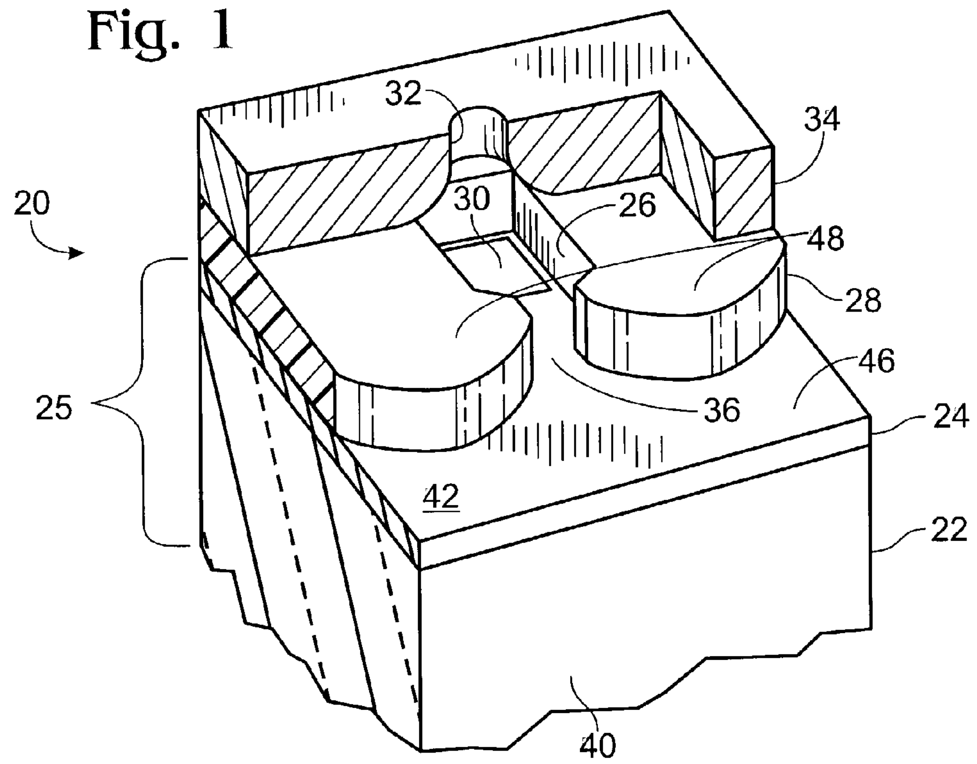
FIG. 1 is a perspective cutaway view of a piece of an ink-jet printhead, the fabrication of which may be carried out, in part, in accordance with one embodiment of the present invention.

With reference to FIG. 1, the method and apparatus of the present invention may be readily understood in the context of an ink-jet printhead, which is an exemplary one of a number of devices that call for etching some material during fabrication. The principles of the invention as well as a preferred embodiment thereof are thus described with reference first to primary components of an ink-jet printhead 20, a piece of the printhead being shown in FIG. 1.

The components of the printhead are formed on a conventional silicon wafer, a part 22 of which appears in FIG. 1. A dielectric layer, such as silicon dioxide 24, has been grown on the silicon part 22. Hereafter, the term substrate 25 will be considered as including the wafer part and dielectric layer. A number of printhead substrates may be simultaneously made on a single silicon wafer. Typically, the dies of the wafer are each made into individual printheads.

Ink is directed into small ink chambers that are carried on the substrate 25. The chambers (designated "firing chambers" 26) are formed in a barrier layer 28, which is made from photosensitive material that is laminated onto the printhead substrate and then exposed, developed, and cured in a configuration that defines the firing chambers.

The primary mechanism for ejecting an ink droplet is a thin-film resistor 30 that is heated to instantaneously form a vapor bubble that expels a droplet of liquid ink from the chamber 26, through an orifice 32 (one orifice being shown cut away in FIG. 1). The resistor 30 is carried on the printhead substrate 25. The resistor 30 is covered with suitable passivation and other layers, as is known in the prior art, and connected to metallic layers that transmit current pulses for heating the resistors. More than one resistor may be located in each of the firing chambers 26.

The printhead substrate may incorporate CMOS or NMOS circuit components (transistors, etc.), or employ other technologies for permitting the use of multiplexed control signals for firing the ink droplets. This simplifies the connection between the printhead and a controller that is remote from the printhead.

In a typical printhead, the orifices 32 are formed in an orifice plate 34 that covers most of the printhead. The orifice plate 34 may be made from a laser-ablated polyimide material. The orifice plate 34 is bonded to the barrier layer 28 and aligned so that each firing chamber 26 is continuous with one of the orifices 32 from which the ink droplets are ejected. Alternatively, the barrier layer 28 and orifice layer 34 may be formed together as a unitary member, such as a photo-developed polymer, and the chambers in that unitary member are aligned with corresponding resistors on the substrate.

Figure 2:
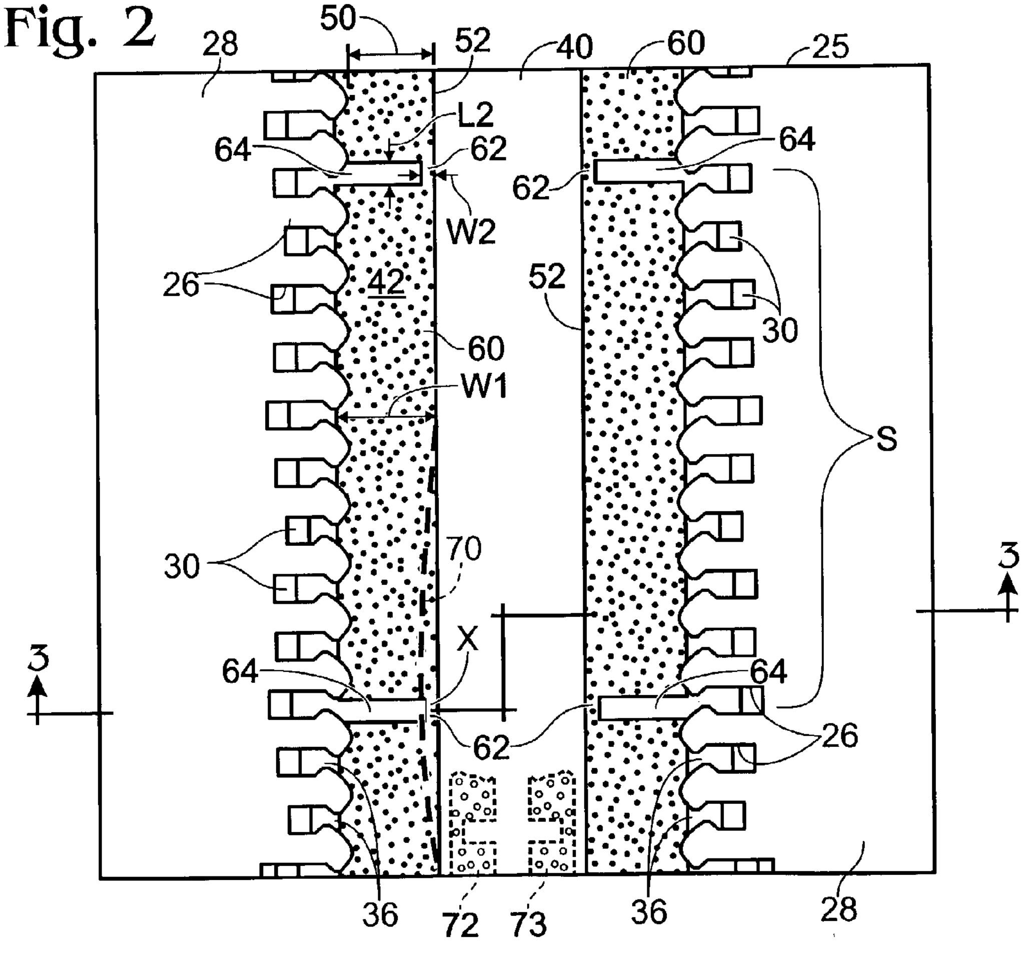
FIG. 2 is an enlarged top plan view of the front side of a piece of an etched silicon substrate for an ink-jet printhead, including some ink-expulsion components and a portion of an etch measurement and control element made in accordance with one embodiment of the present invention.

The firing chambers 26 are refilled with ink after each droplet is ejected. In this regard, each chamber is continuous with a channel 36 that is formed in the barrier layer 28. The channels 36 extend toward an elongated ink feed slot 40 that is formed through the silicon substrate. The ink feed slot 40 may be centered between rows of firing chambers 26 that are located on opposite long sides of the ink feed slot 40. The slot 40 can be made after the ink-ejecting components (except for the orifice plate 34) are formed on the substrate (FIG. 2).

The just mentioned components (barrier layer 28, resistors 30, etc) for ejecting the ink drops are mounted to the front side 42 of the substrate 25. The back side 44 (FIG. 3) of the printhead substrate is mounted to the body of a print cartridge so that the ink slot 40 is in fluid communication with openings to an ink reservoir fluidically coupled to the cartridge. Thus, refill ink flows through the ink feed slot 40 from the back side 44 toward the front side 42 of the substrate 25. The ink then flows across the front side 42 (that is, to and through the channels 36 and beneath the orifice plate 34) to fill the chambers 26 (FIG. 1).

The portion of the front side 42 of the substrate 25 between the slot 40 and the ink channels 36 is known as a shelf 46. The portions of the barrier layer 28 nearest the ink slot 40 are shaped into lead-in lobes 48 that generally serve to separate one channel 36 from an adjacent channel. The lobes define surfaces that direct ink flowing from the slot 40 across the shelf 46 into the channels 36. Examples of lead-in lobes 48 and channel shapes are shown in the figures. Those shapes form no part of the present invention.

The shelf length 50 (FIG. 2) can be considered as the distance from the edge 52 of the slot 40 (at the substrate front side 42) and the nearest part of the lead-in lobes 48. It is typical that this shelf length be precisely established during fabrication of the printhead. For example, some aspects of the performance of an inkjet printer (such as ink chamber refill rates; hence, firing frequency) will directly correlate to the shelf length.

The ink feed slot 40 in the printhead substrate is formed by the controlled removal of a portion of the silicon substrate. That portion is removed by etching. There are a number of known approaches to etching the silicon to form the slot.

Generally, etching can be either chemical or physical, or a combination of both. Chemical etching is done in either a liquid (wet) or gas (dry, or plasma) environment in which chemicals are used to dissolve selected material. In wet chemical etching, the wafer is placed in a material-selective liquid chemical, such as tetramethyl ammonium hydroxide (TMAH), that dissolves an exposed part of the silicon material. In dry etching, material to be etched is bombarded with a highly selective gaseous chemical. Physical etching involves bombarding a wafer with high-energy ions that chip off material. Etching with laser energy is also possible.

Another method for forming the ink feed slot 40 in the substrate is known as abrasive jet machining. This approach uses compressed air to force a stream of very fine particles (such as aluminum oxide grit) to impinge on the back side 44 of the substrate for a time sufficient for the slot to be formed. This abrasive jet machining is often referred to as drilling or sandblasting. For the purposes of this description, however, this approach will be included with those subsumed by the term etching.

The silicon etching process is a gradual one. The width of the slot "SW"(see FIG. 3) gradually grows during the etching process to reach the desired design width at a particular depth in the slot, such as measured at the edge 52.

Irregularities in the substrate or in the etching process may cause the width "SW" to enlarge beyond an acceptable amount, outside of design tolerances. For example, in the exemplary printhead embodiment, an excessively wide slot 40 reduces the shelf length 50 (FIG. 2), thus altering the expected performance of the device. Moreover, a slot that is too wide may cause the metallic layers to be exposed to ink, thereby causing corrosion and failure of the ink-expulsion components of the printhead. For convenience, an excessive amount of etching will be hereafter referred to as an "over-etching."

In accord with an embodiment of the present invention, therefore, the silicon 22 is provided with a conductive element, hereafter referred to as a detector element 60, that is located adjacent to the portion of the silicon that is to be etched away to form slot 40. This detector element is useful during and/or after the etching process as a simple and robust way to determine the extent of the silicon etching, thereby determining the acceptability of the etched part. One embodiment of the invention, incorporated into an exemplary printhead, is described next with particular reference to FIGS. 2-4.

Figure 3:
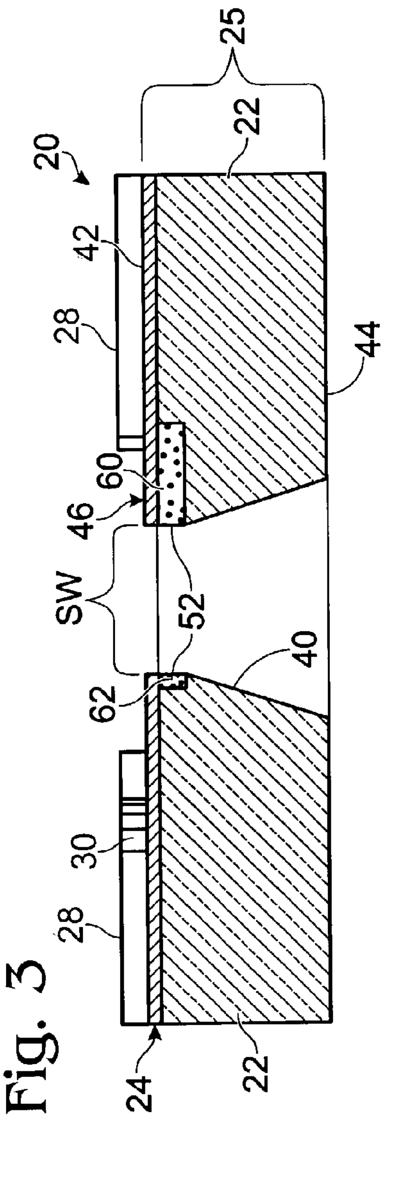
FIG. 3 is an enlarged cross section diagram taken along line 3-3 of FIG. 2, but omitting layer 34.

In one embodiment, the detector element 60 is comprised of a doped strip of the silicon. Two such detector elements are shown in FIG. 2, one adjacent to each opposing edge 52 of the slot 40. In one embodiment, the strip of silicon is doped by conventional means (such as ion implantation or diffusion) with impurities to make the detector element 60 an n-type region. The dots in FIGS. 2 and 3 represent the doped portion of the silicon 22.

It will be appreciated that the doping procedure for providing the detector elements 60 may be undertaken simultaneously with doping that is used in the fabrication of components in other portions of the silicon, such as the firing-control transistors that may be incorporated on the printhead, as mentioned above.

In one embodiment, the resistance of the detector element 60 is determined after the formation of the slot 40 by etching. As will become clear upon reading this description, the detector element 60 is configured and arranged so that a slot 40 that is over etched will disintegrate a piece of the detector element 60 and thereby produce a detectable electrical discontinuity that can be sensed as a very high resistance (essentially an open circuit) in the detector element. The discontinuity thus represents an unacceptably wide slot. Once detected, the wafer die carrying the unacceptably wide slot can be marked as rejected.

The detector element 60 is shaped in a way that provides a significantly lower-resistance across the length of the intact detector element for speedy, accurate measure of the resistance of the detector element using standard IC test equipment, while still providing high sensitivity for determining very small amount of slot over-etching. In this regard, the detector element 60, when considered along its length and in plan view (such as FIG. 2) has a variable width that provides lower resistance than a uniform-width detector element.

Figure 4:
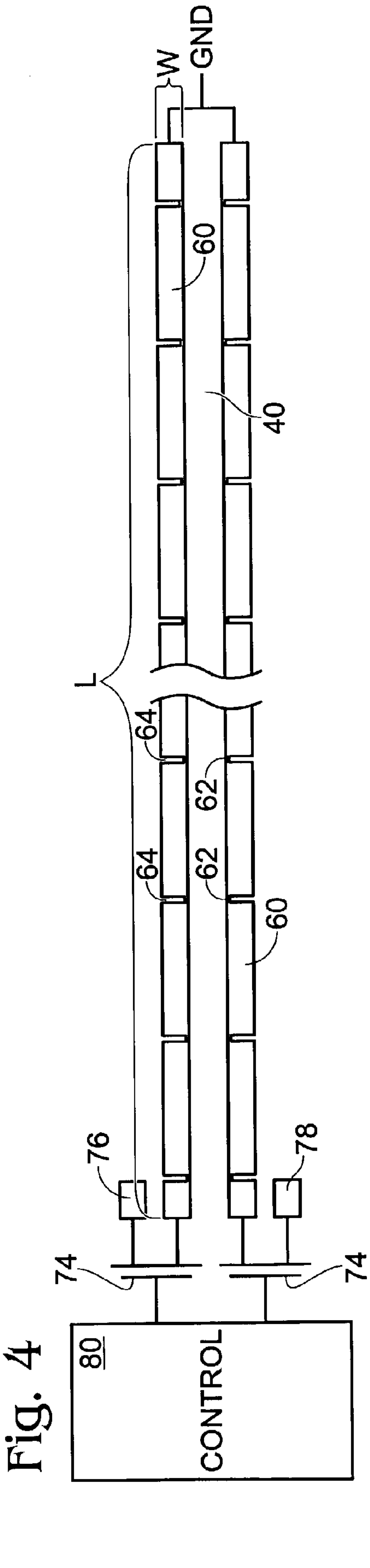
FIG. 4 is a diagram illustrating test components associated with an etch measurement and control element made in accordance with one embodiment of the present invention.

It is noteworthy here that in considering resistance in a doped member, such as detector element 60 (which may also be characterized as a "semiconductive wire"), it is often convenient to work with a unit called the "sheet resistance." In a uniformly doped circuit element, this sheet resistance is specified in units of "ohms per square," where the number of unit squares corresponds to square segments of the element across its length "L" as viewed in plan (See FIG. 4). For example, an—element having a length L of 25,000 μm and a uniform width W of 5 μm and a sheet resistance of 3000 ohms/square would have a resistance of (25,000/5) *3000=15 megohms, a value that is very difficult to measure. An element of the same sheet resistance and length but 50 μm wide would have a resistance of (25,000/50) *3000=1.5 megohms, a value ten-times lower than the 5 μm-wide element, and readily measured with high confidence using typical lab equipment.

With reference to FIG. 2, the present detector element 60 is shaped to have a relatively wide width W1 (measured horizontally in FIG. 2) along most of its length to achieve the advantageous low-resistance measurements mentioned above, but that width is reduced to width W2 in relatively narrower parts at selected locations along the length of the detector. For convenience, the narrower parts are referred to herein as "links" 62. The presence of the links 62 spaced along the length of the detector element 60 ensures that that a small amount of over-etching of the silicon will disintegrate at least one of the links 62, thereby producing a discontinuity in the detector element 60, which can be readily determined by a corresponding jump in the resistance of that detector element. The dashed line 70 of FIG. 2 illustrates where the edge 52 of the slot might be as a result of over-etching, which over-etching also removes one of the links 62 to produce a discontinuity at the location "X" depicted there.

It will be appreciated that what is characterized as over-etching may also occur when mechanisms that are used to define the location of the feed slot 40 are misaligned. Thus, even though a slot of correct width is produced, an over-etch condition will be detected because a misaligned slot will cause disintegration of a link 62.

The links 62 are of narrow width W2 and of short length L2 (that is, short as measured in the direction of the length of the detector; vertically in FIG. 2) so that the number of unit squares in the links 62 is minimal, thereby minimizing the increase in the overall resistance of the detector element that is attributable to the narrow links.

In an embodiment as discussed here in connection with the printhead slot 40, a suitable detector element 60 may have width W1 about 50 or more μm wide, with the width W2 of its links 62 being about 10 percent of that width or 5 μm wide. The length L2 of links may be about 10 μm long. Other doping and processing techniques may permit even narrower (than 5 μm) links. If such narrower links are employed, the links can be made correspondingly shorter to maintain the 2:1 length-to-width ratio just described.

One may also consider the overall detector element 60 as being notched, as at 64 (FIG. 2), to form the links 62, the notches being spaced at spacing S a minimum of about 100 pm apart, more typically about 250 μm 500 μm apart, and not more than about 1000 μm apart, in an embodiment as described here.

Of course, the size of the detector element 60 and the relative sizes and spacing of the links 62 can be varied for selected design tolerances relating to whatever slot or trench configuration is being fabricated. For example, one can use as many notches links 62 as possible (thereby enhancing the physical sensitivity of the detector element) while remaining within a maximum desired resistance level, such as 5 megohms, for sensing an intact detector element.

In one embodiment, the detector element 60 is shaped and doped to provide a total resistance of less than about 5 megohms; in another embodiment, less than about 1 megohm. A wide range of resistance levels may be suitable. Also, the silicon may be doped to form the detector element as a p-type region, if desired. Also, metal or any other semiconductive thin-film layer can be used to form a detector element.

As can be seen in FIG. 2, in one embodiment the links 62 are aligned along an edge of the detector element 60 that abuts the edge 52 of the slot 40 so that slight over etching of the slot (as shown in dashed line 70 of FIG. 2) will disintegrate a link 62 as mentioned above. In some embodiments, another detector element 60 is located at the opposing edge 52 of the slot 40 to permit detection of over-etching on either side. Moreover, a slot or similar feature to be etched could be completely surrounded with a detector element.

It is also contemplated that another detector element (a portion of which is illustrated in dashed lines at 72 near a slot edge 52, FIG. 2) could be located in the portion of the silicon that is intended to be etched away. A second such detector element 73 could be located near the opposing slot edge. The resistance of the detector elements 72, 73 could be sensed to determine whether a desired, minimum amount of etching has occurred to define a desired minimum slot width. The minimum amount of etching would not occur, in this example, until the etching has removed enough slot material to produce a discontinuity in both elements 72, 73.

FIG. 3 shows in cross section the exemplary slot 40 and detector elements 60 of FIG. 2. It will be appreciated that while a through-slot 40 in the silicon 22 has been depicted, a detector in accordance with the present invention may be used with any shape etched into the silicon (grooves, pits etc), as well as for detecting etching of any feature in a MEMS device or in any other silicon-micromachined component.

As mentioned above, the measure of the resistance of the detector element 60 (hence, the presence or lack of over-etching) can be sensed by standard IC test equipment. FIG. 4 shows a diagram of one embodiment for measuring the resistance of the two detector elements 60 that straddle the etched slot 40 discussed above. As seen in FIG. 4, one end of both detector elements is grounded. The other end of each detector element 60 is connected via transistors 74 to exposed test probe contacts 76, 78. The transistors 74 may be part of the CMOS control components 80 incorporated in the printhead for providing the resistor control signals as well as power for testing the detector element resistance. With power applied to the elements 60, the standard test equipment (with probes applied to the contacts 76, 78) will provide a quick determination of the detector element resistance.

It is noteworthy that contacts, such as shown at 76, 78 can be internal to a completed device, and the detector element resistance sensed as part of a self-testing mode of the device, thereby eliminating the need for any external probes. Moreover, such contacts could be inductively coupled to an external resistance meter. Such coupling would be particularly useful in instances where, for example, a detector element is monitored during the etch process.

The etching described above was, for illustrative purposes, described in connection with the formation of an ink feed slot in a silicon-based ink jet printhead. As mentioned earlier, however, the present invention has utility in any circuitry fabrication where a material layer is etched. A detector element may be incorporated into any semiconductive material layer for gauging the removal of adjacent portions of that layer.

Also, although the resistance of the detector element may be sensed upon completion of the etching process, it is also contemplated that a process may be readily assembled for sensing the resistance of the detector element during the etching process of the component in which the detector element is formed. Thus, rather than testing the element after the etch process to determine whether the etching has gone too far, the assembly can be used for testing the detector element for a discontinuity during the etch process. Such a detector is located (as for example, the detectors 72, 73 described above) and sensed to provide real-time control for indicating, as an example, the end point of an etching process thereby to immediately halt the etch process at the time the discontinuity is determined.

It is sometimes useful to control etching by heavily doping the material (such as silicon) with, for example, boron. In high concentrations, boron diffused in the silicon will significantly inhibit an etchant, such as TMAH mentioned above. It will be appreciated that the heavy boron doping can be used to define a portion of "etch-inhibited" silicon that remains after etching. Thus, the silicon that is not doped with boron is etched away, up to the edges of the remaining, etch-inhibited portion of the silicon.

In accordance with another embodiment of the present invention, one can locate the n-type detector element of the present invention adjacent to the intended edge of the etch-inhibited portion (that is, the edge of the silicon portion that is to be doped with boron) and use that detector element as a gauge that indicates whether the boron diffusion is properly aligned. Specifically, with the n-type detector element in place, a misaligned boron diffusion region will "overlap" and dope part of the silicon that carries the detector element, thereby creating (where the boron diffusion overlaps the detector element) a region of pn junctions in the detector element. The resulting pn junctions cause a detectable increase in the resistance of that detector element, thereby indicating imprecise location of the boron diffusion.

Although preferred and alternative embodiments of the present invention have been described above, it will be appreciated that the spirit and scope of the invention is not limited to those embodiments, but extend to the various modifications and equivalents as defined in the appended claims.

The invention claimed is:

1. A device, comprising:

a wafer that includes an etch portion to be etched, the etch portion having an etch length greater than or equal to an etch width; and an electrically conductive etch-control element having a variable width within the etch length of the etch portion, the etch-control element comprising doped parts of the wafer, and the variable width of the etch-control element comprising portions of reduced width provided along one edge of the etch-control element and spaced along the etch length of the etch portion.

2. The device of claim 1 including means for applying voltage to the etch-control element to test continuity of the etch-control element upon etching of the etch portion.

3. The device of claim 1 wherein each portion of reduced width of the etch-control element is about 10 percent of the width of a remaining part of the etch-control element.

4. The device of claim 1 wherein the etch-control element is arranged to substantially surround the etch portion.

5. The device of claim 1 wherein the etch-control element is doped to define an n-type region.

6. The device of claim 1 wherein the etch portion is sized to define a slot that extends completely through the wafer after the etch portion is etched away.

7. The device of claim 1 wherein the etch-control element is doped to define a p-type region.

8. The device of claim 1 wherein the portions of reduced width provided along one edge of the etch-control element comprise at least two spaced portions of reduced width provided along the one edge of the etch-control element and spaced along the etch length of the etch portion.

9. The device of claim 1 wherein the etch-control element includes spaced apart notches which form the portions of reduced width provided along the one edge of the etch-control element.

10. The device of claim 9 wherein the notches comprise regions provided along the etch length of the etch portion devoid of doped parts of the wafer.

11. The device of claim 1 further comprising a second electrically conductive etch-control element extending within the etch portion and comprising doped parts of the wafer.

12. The device of claim 11 wherein the second etch-control element is arranged to be partly disintegrated upon etching of the etch portion.

13. An etch detector configured to be etched for use with material that has a portion to be etched, the portion to be etched having an etch length greater than or equal to an etch width, and a portion of the etch detector comprising an elongated, notched, doped portion of the material having a variable width within the etch length of the portion to be etched, wherein the variable width of the elongated, notched, doped portion of the material comprises notches in the doped portion of the material provided along one edge of the detector at spaced apart locations.

14. The detector of claim 13 wherein the notches in the doped portion of the material comprise at least two spaced notches in the doped portion of the material provided along the one edge of the detector.

15. The detector of claim 13 wherein the notches in the doped portion of the material reduce by about 90 percent the width of the detector.

16. The detector of claim 13 wherein the notches in the doped portion of the material are spaced apart by less than 1000 μm.

17. The detector of claim 13 wherein the variable width of the elongated, notched, doped portion of the material comprises doped portions of reduced width provided along the one edge of the detector and spaced along the etch length of the portion to be etched.

18. The detector of claim 13 wherein the elongated, notched, doped portion of the material comprises gaps in the doped portion of the material along the etch length of the portion to be etched.

19. The detector of claim 13 wherein a resistance of the detector is less than about 5 megohms.

20. The detector of claim 19 wherein the resistance of the detector is about 1 megohm.

21. The detector of claim 13 wherein the notches in the doped portion of the material define narrow portions of the detector that connect between two relatively wider portions of the detector.

22. The detector of claim 21 wherein the narrow portions of the detector are spaced along the one edge of the detector.

23. A device, comprising:

a wafer that includes an etch portion to be etched, the etch portion having an etch length greater than or equal to an etch width; and an electrically conductive etch-control element having a variable width within the etch length of the etch portion, the etch-control element comprising doped parts of the wafer, and the variable width of the etch-control element comprising portions of reduced width provided along one edge of the etch-control element and spaced along the etch length of the etch portion, wherein the etch portion is sized to define a slot that extends completely through the wafer after the etch portion is etched away and wherein the wafer further comprises mechanisms for controlled expulsion of liquid that is moved through the slot.

24. The device of claim 23 wherein the mechanisms are spaced from the etch-control element.

25. An etch detector configured to be etched for use with material that has a portion to be etched, the portion to be etched having an etch length greater than or equal to an etch width, and a portion of the etch detector comprising an elongated, notched, doped portion of the material having a variable width within the etch length of the portion to be etched, wherein the variable width of the elongated, notched, doped portion of the material comprises notches in the doped portion of the material provided along one edge of the detector at spaced apart locations wherein the notches in the doped portion of the material are spaced apart by less than 1000 μm, and wherein the notches in the doped portion of the material are spaced apart by a distance of between about 250 μm and 500 μm.

* * * * *